United States Patent
Pawlowski et al.

(10) Patent No.: US 9,736,968 B2
(45) Date of Patent: Aug. 15, 2017

(54) DEVICE FOR CLAMPING A PRINTED CIRCUIT BOARD MODULE IN A MOUNTING GROOVE

(71) Applicant: Schroff GmbH, Straubenhardt (DE)

(72) Inventors: Adam Pawlowski, Waldbronn (DE); Paul Rutherford, Karlsruhe (DE)

(73) Assignee: Pentair Technical Solutions GmbH, Straubenhardt (DE)

( * ) Notice: Subject to any disclaimer, the term of this patent is extended or adjusted under 35 U.S.C. 154(b) by 495 days.

(21) Appl. No.: 13/890,381

(22) Filed: May 9, 2013

(65) Prior Publication Data
US 2013/0309007 A1   Nov. 21, 2013

(30) Foreign Application Priority Data

May 21, 2012   (EP) .................................... 12168664

(51) Int. Cl.
*H05K 7/20*   (2006.01)
*H05K 7/14*   (2006.01)

(52) U.S. Cl.
CPC ....... *H05K 7/20509* (2013.01); *H05K 7/1404* (2013.01); *H05K 7/20545* (2013.01); *Y10T 403/7062* (2015.01); *Y10T 403/7066* (2015.01); *Y10T 403/7067* (2015.01)

(58) Field of Classification Search
CPC .............. H05K 7/1407; H05K 7/1404; H05K 7/20509; H05K 7/20545; Y10T 403/7064; Y10T 403/7066; Y10T 403/7067; Y10T 403/76

USPC ................... 403/374.1–374.5, 349, 350–352
See application file for complete search history.

(56) References Cited

U.S. PATENT DOCUMENTS

| | | | | |
|---|---|---|---|---|
| 4,354,770 A * | 10/1982 | Block | ........................ | 403/409.1 |
| 4,819,713 A | 4/1989 | Weisman | | |
| 4,837,993 A * | 6/1989 | Studenski | ...................... | 52/208 |
| 5,472,353 A | 12/1995 | Hristake et al. | | |
| 5,485,353 A | 1/1996 | Hayes et al. | | |
| 5,711,628 A * | 1/1998 | Fletcher | .......................... | 403/5 |
| 5,859,764 A | 1/1999 | Davis et al. | | |
| 6,285,564 B1 * | 9/2001 | O'Brien | ....................... | 361/801 |

(Continued)

FOREIGN PATENT DOCUMENTS

| | | | |
|---|---|---|---|
| EP | 0 071 398 A1 | 2/1983 | |
| EP | 0 772 380 A1 | 5/1997 | |

(Continued)

*Primary Examiner* — Joshua Kennedy
(74) *Attorney, Agent, or Firm* — Quarles & Brady LLP

(57) ABSTRACT

A device for retaining a printed circuit board module in a mounting groove of a cold plate, the device comprising an elongated housing made of metal, which has a cross-section in the shape of a horizontal U. A pressure piece made of metal is mounted in the housing so as to be displaceable transversely relative to the rotational axis of the housing and comprises a flat clamping surface on the front side. A rotary cylinder can be rotatably mounted in the housing so as to be transversely displaceable relative to the rotational axis. During a rotation, eccentric guide elements can be used to effect a forward displacement of the rotary cylinder. The pressure piece follows the displacement of the rotary cylinder and slides outward. The waste heat of the printed circuit board module is transported via the housing and the pressure piece to the cold plate.

23 Claims, 5 Drawing Sheets

(56) References Cited

U.S. PATENT DOCUMENTS

| | | | |
|---|---|---|---|
| 7,322,843 B1* | 1/2008 | Lee et al. | 439/327 |
| 7,349,221 B2* | 3/2008 | Yurko | 361/719 |
| 7,505,251 B2* | 3/2009 | Canfield et al. | 361/679.02 |
| 8,559,178 B2* | 10/2013 | Monson et al. | 361/700 |
| 8,967,903 B1* | 3/2015 | Sharfi | 403/374.4 |
| 2013/0003316 A1* | 1/2013 | Martin | 361/720 |

FOREIGN PATENT DOCUMENTS

| | | |
|---|---|---|
| GB | 2 101 812 A | 1/1983 |
| GB | 2 191 046 A | 12/1987 |

\* cited by examiner

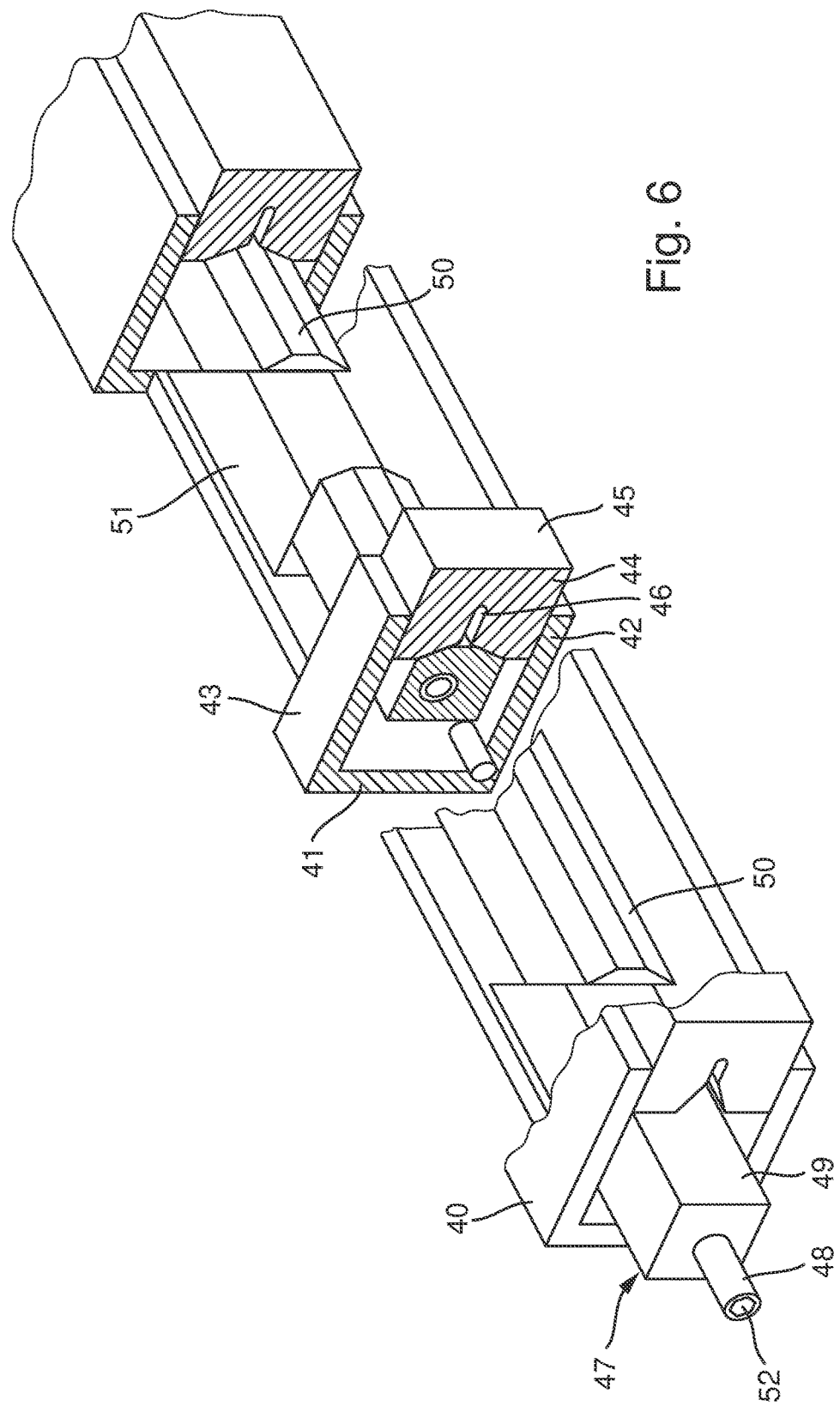

DEVICE FOR CLAMPING A PRINTED CIRCUIT BOARD MODULE IN A MOUNTING GROOVE

CROSS REFERENCE TO RELATED APPLICATIONS

This application claims priority to European Patent Application serial no. EP 12 168 664.6 filed on May 21, 2012 entitled DEVICE FOR CLAMPING A PRINTED CIRCUIT BOARD MODULE IN A MOUNTING GROOVE, the disclosure of which is hereby incorporated herein by reference.

BACKGROUND

The invention relates to a device for clamping a printed circuit board module in a mounting groove of a cold plate.

A modular design has become established in industrial electronics. Electronic components such as processors, semiconductor chips, resistors and capacitors are placed on printed circuit boards having a standardized size. Several printed circuit boards are then inserted into a housing or a mounting rack and locked in place there. The rear edges of the individual printed circuit boards carry multi-pin connectors, which upon insertion are mechanically and electrically connected to corresponding connectors of a backplane in the housing or card cage.

Special, very high demands are placed on the mechanical stability and dustproofness of electronic devices for applications in rough environments, such as on ships, in airplanes, during mobile communication or in the oil and gas industry. As the performance and component density of electronics are continually on the rise, cooling the electronic components, notably the processors, poses a special challenge.

Especially stable modular systems have been developed for such special requirements, in which the electronic printed circuit boards are packed between metal plates, and the resulting printed circuit board modules are not inserted in conventional guide rails, but are mounted to special mounting plates made of solid metal. For this purpose, grooves having a rectangular cross-section are worked into the mounting plates and receive the lower edge of a printed circuit board module.

Packing the printed circuit boards in metal plates not only provides mechanical protection for the sensitive electronics, but is also used to dissipate loss to the outside. Dissipating heat from such conduction-cooled modules takes place by way of the metallic mounting plate, which is why this can also be referred to as a cold plate.

So as to achieve the necessary high mechanical stability and optimal heat dissipation, it is not sufficient to simply insert the printed circuit board modules into the mounting grooves of the cold plate and lock them in place there so as to prevent these from being inadvertently pulled out. Rather mounting takes place by way of special clamping devices, which are inserted into the mounting groove parallel to the printed circuit board module and then clamp the lower edge of the module between the walls of the mounting groove.

Clamping retainers for establishing a positive and non-positive connection between the printed circuit board module and the cold plate, while also establishing good heat-conducting contact for the purpose of heat dissipation, are known from the prior art and are offered by CALMARK Corporation, CA 91776, USA, for example, by the designation Card-Lok. Similar clamping retainers are distributed by Pentair Inc., Minneapolis, USA under the trade name BIRTCHER Wedge-Lok. U.S. Pat. No. 5,485,353 relates to such a clamping retainer.

The previously known mounting devices comprise a number of wedge-shaped pieces, which are arranged in a row on a threaded shaft and held together by the same. The wedge-shaped pieces are pulled together by a rotation of the threaded shaft, wherein at least one wedge-shaped piece gives way laterally under the pressure that is placed on the wedge surfaces thereof. The mounting device thus widens, whereby the same becomes clamped in the mounting groove of the cold plate. These and similar mounting devices comprising wedge-shaped clamping elements are described, for example, in U.S. Pat. No. 4,819,713 (corresponds to DE 3 890 343 C2), EP 0 772 380 B1 or GB 2191046 A (corresponds to DE 3 717 689 A1).

Although the aforementioned mounting devices comprising wedge elements have been successfully applied for many years, they are also associated with drawbacks, in particular in terms of the ability to remove heat from the conduction-cooled printed circuit board modules. The bevels of the wedge-shaped pieces sliding on top of each other provide only a relatively small surface through which the heat can flow. This is because the wedge-shaped pieces are not solid, but have to be designed as U profiles, so that the threaded spindle can be guided through these. Only those wedge-shaped pieces that give way laterally under the pressure of the threaded spindle are seated against the groove wall in a planar manner. As a result, on the length of these pieces is available as a contact surface for transmitting heat to the cold plate. The wedge elements displaced in the opposite direction can give off the absorbed heat to the neighboring wedge elements only via the relatively small bevel surfaces.

U.S. Pat. No. 5,859,764 discloses a clamping device comprising an elongated U-shaped housing and a wedge-shaped pressure piece (see FIG. 5), which is displaceably mounted in the housing and has a flat clamping surface at the front side. The back side of the wedge-shaped pressure piece is seated against a laterally reversed second sub-piece and the pressure piece can be displaced transversely relative thereto. A long screw penetrates the two sub-pieces and connects these to each other. When the screw is rotated, the two wedge-shaped sub-pieces are displaced relative to each other. This causes the front sub-piece to be moved through the open front side out of the U-shaped housing, wherein it must lose contact with the lateral walls of the housing. Heat transmission from the housing to the pressure element is thus no longer assured over the entire length of the pressure piece.

SUMMARY

The present invention creates a device for clamping a printed circuit board module in a mounting groove of a cold plate. the device having a simple design, being stable and easy to operate and generating sufficiently high clamping forces, and notably offering improved heat dissipation from the printed circuit board module to the cold plate.

In accordance with one embodiment, a pressure piece moves out of a U-shaped housing and a flat pressure surface that is designed at the front side of the pressure piece is seated against the opposing wall of the mounting groove. Pressure is generated by a drive mechanism, which according to one embodiment is disposed between the back wall of the U-shaped housing and the pressure piece, and pushes the pressure piece forward through the open front side of the housing, at least far enough for the pressure piece to protrude beyond the parallel lateral walls of the housing. In this pushed-forward position, the pressure piece is seated against a wall of the mounting groove, so that a clamping force can be generated transversely relative to the groove. The back wall of the housing is pressed against the printed circuit board module for this purpose.

According to this embodiment, the clamping device is expanded or spread by pushing the pressure piece out of the open housing. As compared to the known clamping retainers comprising wedge-shaped pieces, which are displaced relative to each other out of the longitudinal axis and pushed against a wall of the mounting groove, the pressure piece according to this embodiment can be designed to extend over the entire length of the housing. If needed, the pressure piece may also be subdivided. However, in any case, the entire length of the pressure piece is available for transmitting clamping forces and notably for heat transmission. This is supported in that the pressure piece is mounted so as to slide between the lateral walls of the housing, so that large-surface-area contact exists between the housing and the pressure piece, by way of which heat can be removed from the printed circuit board module by means of conduction. The transitions between the bevels of the wedge-shaped pieces sliding on each other, which are common in conventional designs and have been found to pose a bottleneck for heat transmission because of the relative small surfaces, are bypassed by the design according to the invention and replaced with comparatively large contact surfaces between the housing and pressure piece.

The pressure piece can extend over the entire length of the housing, notably if it is produced from solid steel. However it is also possible to design the pressure piece in multiple pieces, which can be considered in particular if the housing is designed to be very long and to be used for retaining printed circuit board modules having a corresponding long edge length. However, the pressure sub-pieces always move parallel to each other and in the same direction, which is to say the clamping sub-surfaces are always located in one plane.

The pressure piece advantageously has a substantially rectangular cross-section, which is matched to the cross-section of the U-shaped housing. The pressure piece is thus slideably mounted directly between the lateral walls of the housing. This produces large-surface-area contact, via which the heat is transmitted from the housing directly to the pressure piece and from there to the cold plate.

So as to prevent the pressure piece from falling out of the front side of the housing, the upper face and lower face of the pressure piece advantageously include respective stop edges, with corresponding angled stops being provided on the housing in the region of the front edges of the lateral walls. The pressure piece in such an embodiment always remains connected to the housing, for example, while the clamping device is being transported, which is to say when no opposing force acts from the outside onto the pressure piece, holding the same in the housing.

Another measure for improving heat dissipation is to provide the back side of the pressure piece with a central longitudinal slot, which extends over the entire length. This longitudinal slot acts as a notch and causes the pressure piece to slightly bend open under the mechanical pressure that is exerted by the drive mechanism on the pressure piece, whereby the pressure piece becomes seated from the inside against the lateral walls of the housing, resulting in very good heat transmission.

A variety of drive mechanisms can be employed to displace the pressure piece parallel to the back wall of the housing. An important aspect is that the drive mechanism is disposed in the interior of the U-shaped housing and is able to generate a clamping force between the displaceably mounted pressure piece and the stationary back wall of the housing, and that it is possible to operate the mechanism manually from the outside.

An eccentric mechanism can be employed as the drive mechanism, for example, which during a rotation about a rotational axis effects a displacement of the pressure piece relative to the lateral walls of the housing. Such an eccentric mechanism advantageously comprises a rotary cylinder, which can be rotated about the rotational axis thereof, this axis being parallel to the longitudinal axis of the housing, and is also mounted in the housing so as to be transversely displaceable relative to the rotational axis, and which comprises at least one eccentric guide element, which during a rotation about the rotational axis effects a displacement of the rotary cylinder transversely relative to the longitudinal axis, wherein the rotary cylinder is coupled to the pressure piece so that the pressure piece follows the displacement of the rotary cylinder. The rotation of the rotary cylinder, and thus the actuation of the clamping mechanism, takes place manually, for example by way of a commercially available screwdriver or wrench, which engages on the rotational axis. The rotary cylinder can be designed to be very stable; it is preferably made of solid metal. This allows a high pressure force on the pressure piece and an accordingly high clamping force to be generated, without the risk of the rotary cylinder becoming deflected. However, if the designs are very long, it is also conceivable for the rotary cylinder to be subdivided and one or more intermediate bearings to be provided in the housing.

The rotary cylinder is advantageously mounted in the housing using bearing pins at the end faces, the pins being mounted in horizontal oblong holes in the end walls of the housing. It also conceivable, of course, for the bearing pins to conversely sit at the end walls of the housing and for the rotary cylinder to have oblong holes at the end faces, the bearing pins engaging in these holes. The oblong holes can also only be designed as blind holes, at least on one side.

The displacement of the rotary cylinder toward the pressure piece requires forced guidance, which translates the rotary motion into a linear motion. For this purpose, eccentrically disposed guide pins can be provided at the end faces of the rotary cylinder, which engage in guide slots or guide grooves in the end walls of the housing. During a rotation of the cylinder about the axis thereof, the guide pins travel along the associated guide slots or guide grooves and thereby effect a displacement of the cylinder in the oblong holes of the housing. The contours of the guide slots or guide grooves determine the movement profile of the rotary cylinder, notably the degree and speed of the displacement in relation to the angle of rotation.

The guide slots or guide grooves are advantageously disposed at an acute angle relative to the oblong holes serving as bearings. During a rotation of the rotary cylinder about the rotational axis thereof, the eccentrically disposed guide pins, by nature, describes a circle, with the rotational axis forming the center. However, the rotational axis may also be displaced transversely relative to the rotational axis in the oblong holes serving as bearings. The angle between the guide slots or guide grooves and the oblong holes serving as bearings determines the degree of displacement of each angular degree of rotation. To this end, the guide slots or guide grooves can be designed in linear fashion, however they may also be slightly curved.

In an advantageous and expedient refinement, the angle between the guide slots or guide grooves and the oblong holes is dimensioned so that the rotary cylinder is prevented from automatically rotating by a self-locking function. The rotary cylinder, which is horizontally displaced due to the rotation, thereby remains in the forward position thereof, and so does the pressure piece, which has followed the displacement of the rotary cylinder. The self-locking function of the eccentric mechanism forms an automatic block, which can only be overcome by actively turning the rotary cylinder in the opposite direction of rotation.

Advantageously at least one bearing pin of the rotary cylinder is guided through the end wall of the housing, so that the pin protrudes from the end wall. At the free end, a holder for the positive engagement of a rotary tool such as a hexagonal wrench, can be provided. Such a removable rotary tool allows the eccentric mechanism to be operated easily and conveniently. In conjunction with the self-locking design of the eccentric mechanism, no additional operating step is required for maintaining the clamping force that is exerted by the rotary tool, with this force not being released again until a later time as needed.

Another possibility to implement a suitable drive mechanism for the pressure piece is the use of a wedge device comprising a number of wedge elements, which are arranged in a row on a threaded shaft, wherein, as a result of a rotation of the threaded shaft, at least one wedge-shaped piece gives way laterally under the pressure that is applied to the wedge surfaces thereof, becomes seated from the inside against the pressure piece, and pushes the same forward and out of the housing. The wedges being displaced in opposite directions push against the back side of the housing from the inside and create the counter-pressure.

Such clamping mechanisms comprising wedges are available in the market, in particular in the form of the known clamping retainers offered, for example, by CALMARK Corporation under the designation Card-Lok. Within the scope of the invention, such a Card-Lok is simply inserted longitudinally into the U-shaped housing, in particular into the space between the back side and pressure piece. The Card-Lok here is not clamped directly between the printed circuit board module and a wall of the mounting groove, but between the inner side of the housing back wall and the back side of the pressure piece. The driving or clamping function is separate from the heat dissipation function, which according to the invention takes place by way of the housing and the pressure piece and is therefore independent of the drive mechanism that is employed.

BRIEF DESCRIPTION OF THE DRAWINGS

Two exemplary embodiments of the invention will be described in more detail hereafter based on the accompanying drawings. In the drawings:

FIG. 6 is a partially cut perspective illustration of an alternative clamping device.

Figure 1:
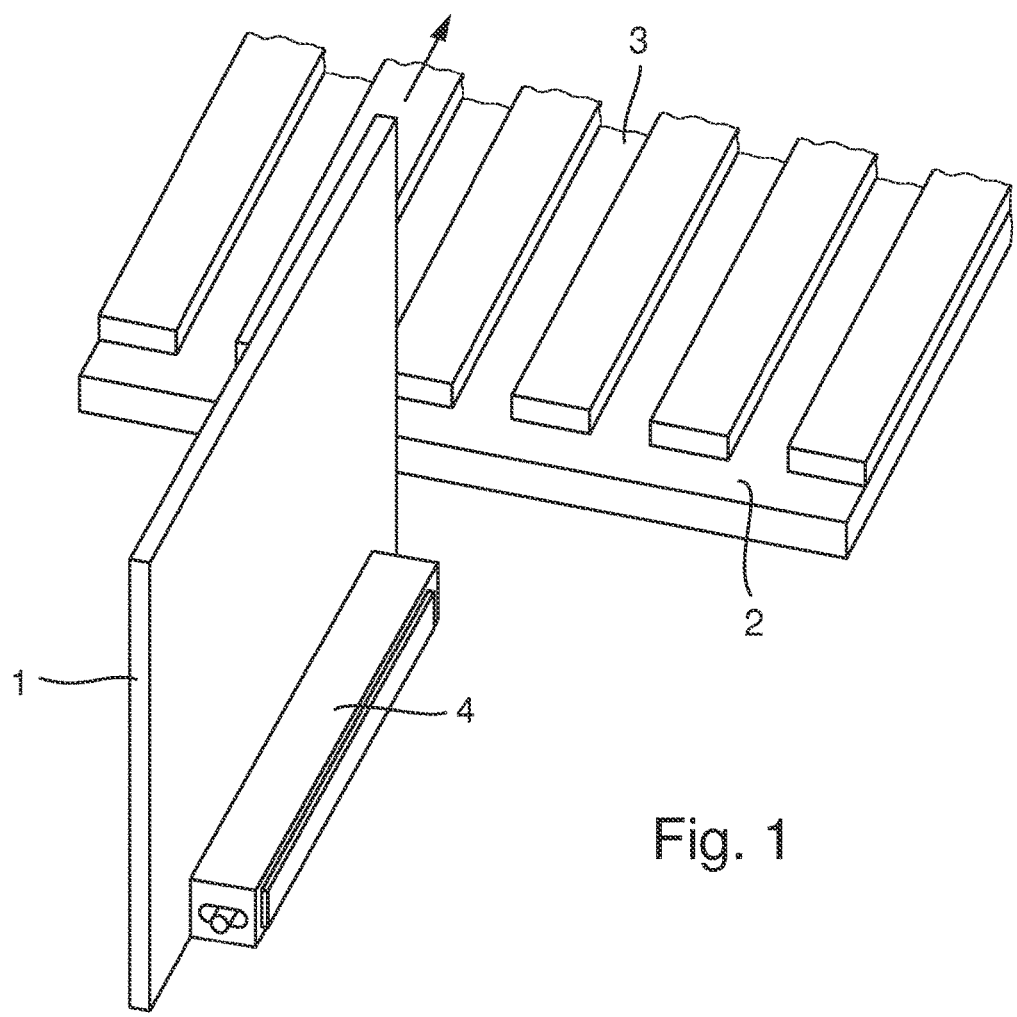
FIG. 1 is a drastically simplified perspective illustration of a printed circuit board module, a clamping device and a cold plate.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DETAILED DESCRIPTION

FIG. 1 shows a printed circuit board module 1, which is to be mounted in an upright position to the upper face of a cold plate 2. For this purpose, a number of parallel mounting grooves 3 are provided on the upper face of the cold plate 2, into each of which a printed circuit board module 1 can be inserted. At least the outer side of the printed circuit board module 1 and the cold plate 2 are produced from metal which conducts heat well so as to remove the heat loss of the electronic components by way of heat conduction.

So as to retain the printed circuit board module 1 in the mounting groove 3 of the cold plate 2, a clamping device is provided, which clamps the lower edge of the printed circuit board module 1 between the groove walls of the mounting groove 3 and also establishes large-surface-area thermal contact between the printed circuit board module 1 and cold plate 2.

Figure 2:
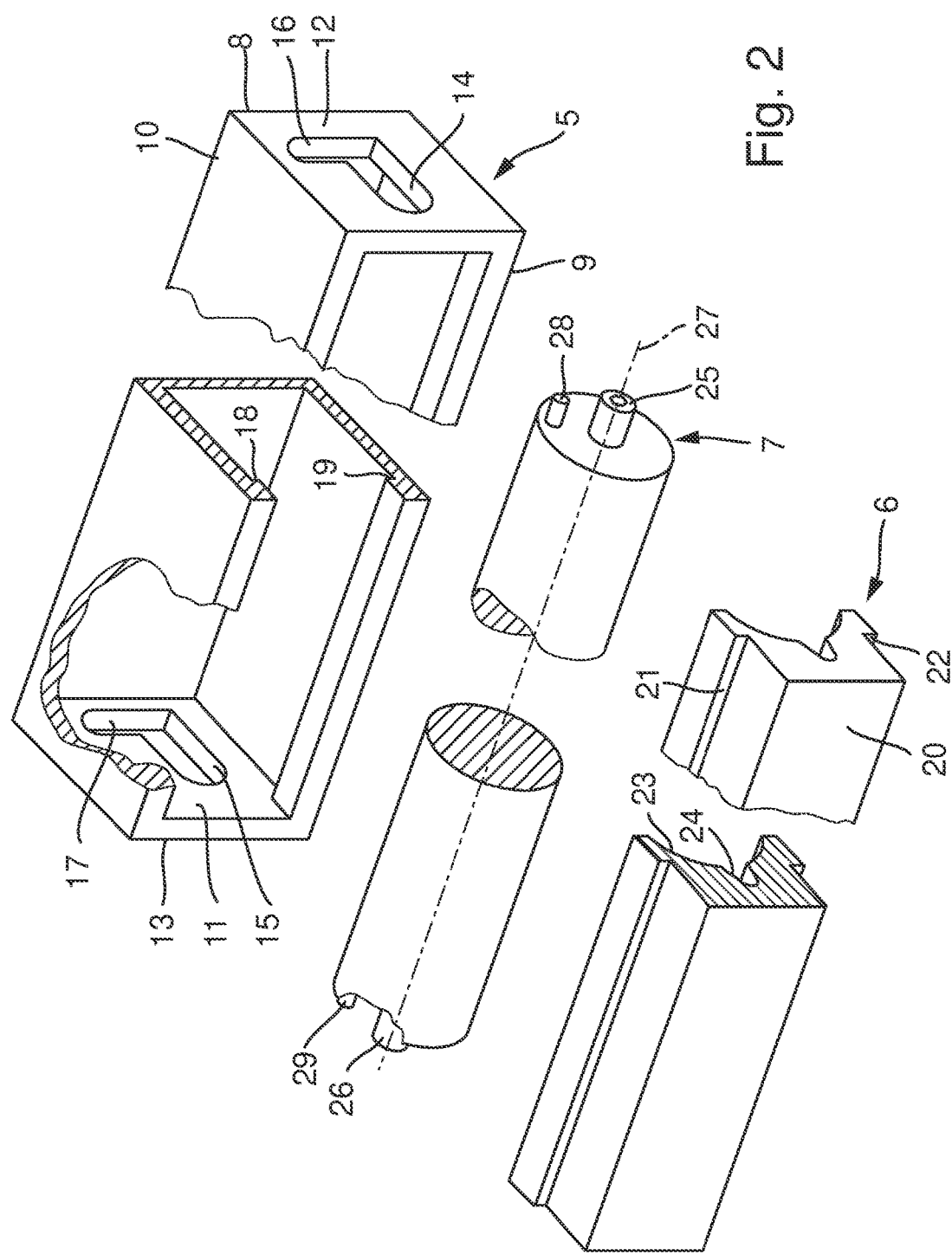
FIG. 2 is a partially cut perspective illustration of the individual parts of the clamping device of FIG. 1.

According to FIG. 2, the clamping device 4 is essentially composed of three components: an elongated housing 5, a pressure piece 6 and a rotary cylinder 7.

The housing 5 has a cross-section in the shape of a horizontal U, wherein the back of the U is formed by the back wall 8 and the parallel U limbs are formed by the lower lateral wall 9 and the upper lateral wall 10. A large rectangular opening 11 takes up the front side of the housing 5. The housing 5 is completed by the right end wall 12 and the left end wall 13.

Oblong holes 14 and 15 are worked into the end walls 12, 13, respectively, wherein the oblong hole 14 is designed as a through-hole and the oblong hole 15 is designed as a blind hole. The oblong hole 14 transitions into a guide slot 16, the width of which is slightly less than that of the oblong hole 14. A corresponding guide slot 17 is provided on the opposing left end wall 13. An upper angled stop 18 and a lower angled stop 19 are provided in the region of the front edges of the housing 5, the cross-section of the stops being designed as short, inwardly directed ribs that adjoin the ends of the U-limbs.

The pressure piece 6 has the basic shape of an elongated cuboid, the shape and dimensions of which are matched to the housing 5. A flat clamping surface 20 is formed at the front side of the pressure piece 6, the surface extending parallel to the back wall 8 of the housing 5. The upper face and lower face of the pressure piece 6 are provided with an upper stop edge 21 and a lower stop edge 22, respectively, which correspond to the angled stops 18, 19 of the housing 5. The back side of the pressure piece 6 has a cut-out 23 having a round cross-section, which is matched to the rotary cylinder 7. A longitudinal slot 24, having the appearance of a notch as regards the cross-section thereof, extends along the center line of the cut-out 23.

The rotary cylinder 7 is designed as an elongated solid roller, the length of which approximately corresponds to the length of the housing 5 and the length of the pressure piece 6. The opposing end walls of the pressure cylinder 7 comprise centric bearing pins 25 and 26, respectively, which define the rotational axis 27 of the cylinder. In addition, guide pines 28 and 29 are eccentrically disposed at the end faces.

Figure 3:
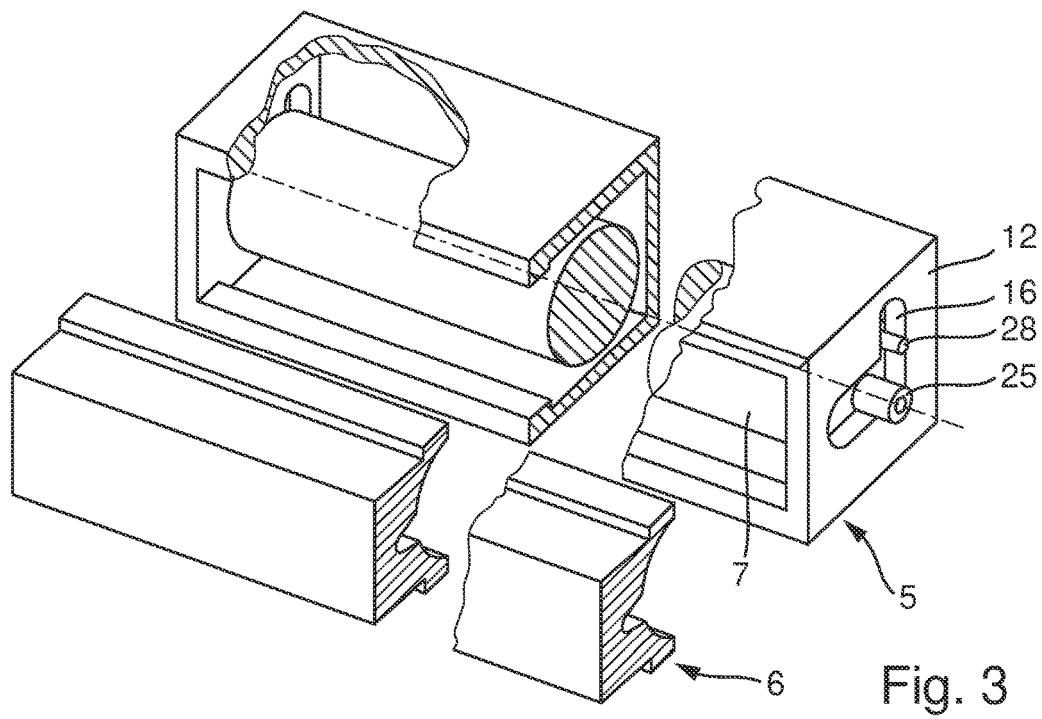
FIG. 3 shows the clamping device of FIG. 2 in a partially assembled state.

In FIG. 3, the rotary cylinder 7 is inserted into the housing 5. The right bearing pin 25 engages in the oblong hole 14 in the right end wall 12 of the housing 5. The left bearing pin 26 (see FIG. 2) engages in the oblong hole 15 in the opposing left end wall 13 of the housing 5. The pressure cylinder 7 is thus mounted in the housing 5 so as to rotate about the rotational axis 27, wherein the cylinder can be displaced horizontally forward or backward in the oblong holes 14, 15. The right guide pin 28 engages in the guide slot 16 in the right end wall 12 of the housing 5, while the left guide pin 29 (see FIG. 2) engages in the corresponding guide slot 17 in the left end wall 13. The guide pins 28, 29 and guide slots 16, 17 form a guide gate for the rotary cylinder 7, which upon rotation about the rotational axis 27 thereof controls the displacement of these elements in the oblong holes 14, 15.

Figure 4:
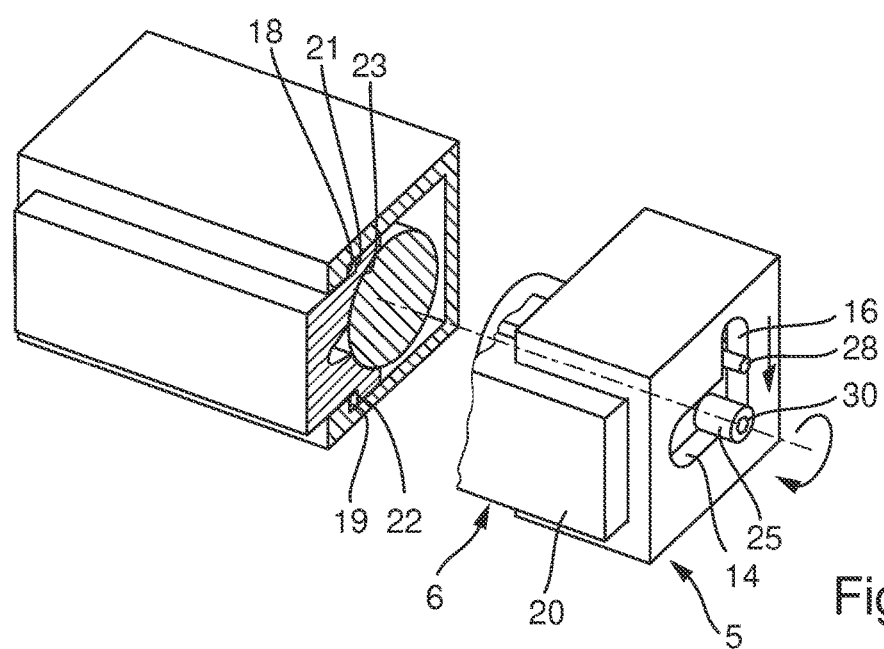
FIG. 4 shows the clamping device of FIG. 2 in the assembled state.

In FIG. 4, the pressure piece 6 is also inserted into the housing 5. The stop edges 21, 22 latchingly engage the angled stops 18, 19 of the housing 5. The rotary cylinder 7 engages in the back cut-out 23 of the pressure cylinder 7, whereby the two parts are in planar sliding contact with each other.

The right bearing pin 25 of the rotary cylinder 7 protrudes through the oblong hole 14 in the right end wall 12 of the housing 5 and a small section sticks out. At the free end of the bearing pin 25, which is thus accessible from the outside, a holder designed as a hexagon socket 30 is provided for the use of a commercially available hexagonal wrench.

During a clockwise rotation, as is indicated in FIG. 4 by the curved arrow, the guide pin 28 travels along the guide slot 16 in the direction of the straight arrow. This causes the rotational axis 27 to be displaced forward. The pressure piece 6 follows this displacement of the rotary cylinder and is thus pushed a certain distance out of the front side of the housing 5.

Figure 5A:
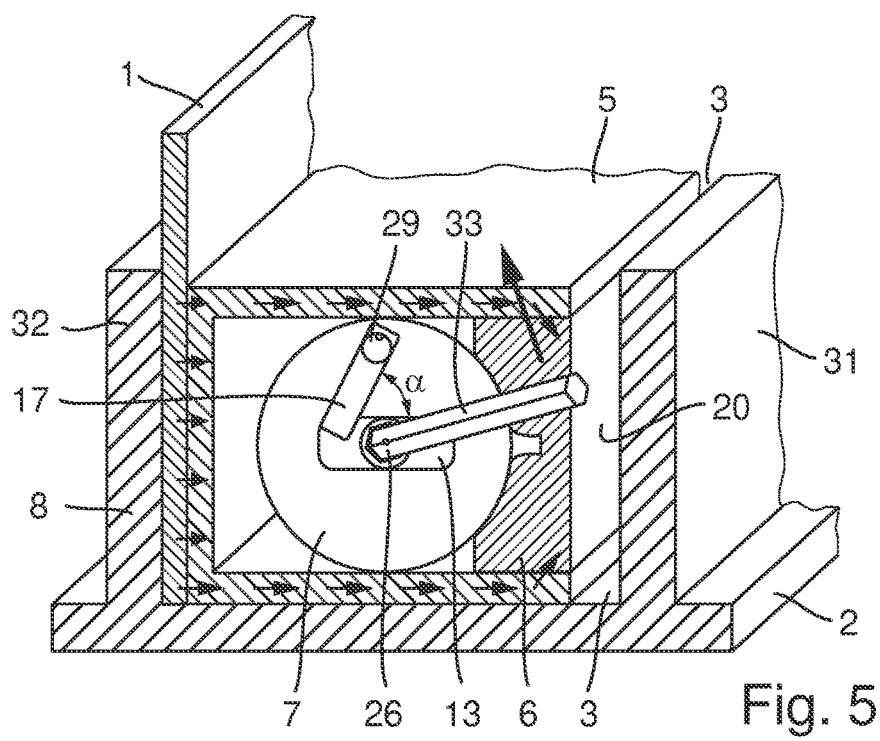
FIGS. 5a, 5b show the function of the clamping device of FIG. 2 in cooperation with a printed circuit board module and a cold plate.

FIG. 5a illustrates the function of the clamping device 4, which here is inserted in the mounting groove 3 of the cold plate 2 in a manner parallel to the printed circuit board module 1. The front end wall of the housing has been omitted in the schematic drawing to allow the movements of the pressure piece 6 and of the rotary cylinder 7 in the housing 5 to be tracked.

At first, the pressure piece 6 is seated entirely inside the housing 5. A gap still exists between the pressure surface 20 and the right groove wall 31 of the mounting groove 3. The back wall 8 of the housing 5 is seated accordingly loosely against the front side of the printed circuit board module 1, the back side of which is seated against the left groove wall 32 of the mounting groove 3, likewise still loosely. The bearing pin 26 of the rotary cylinder 27 is not located far from the rear final position in the associated oblong hole 15, the position of which is indicated in the omitted end wall. In the starting position, the guide pin 29 of the rotary cylinder 7 is located at the upper end of the guide slot 17, the position of which is likewise indicated in the end wall.

Figure 5B:
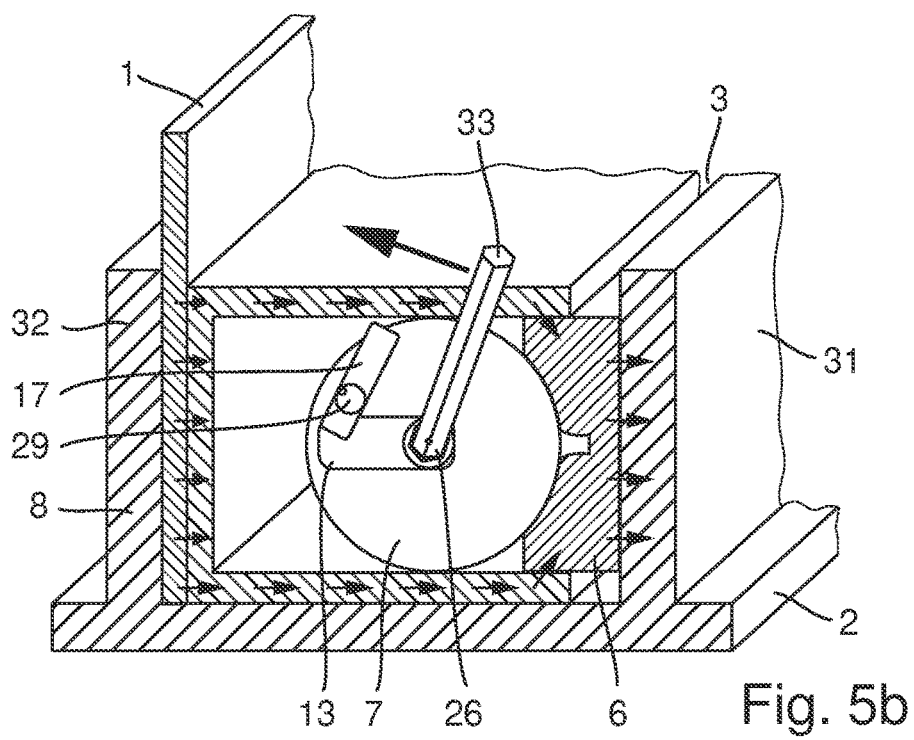

If a hexagonal wrench 33 is now placed onto the free end of the bearing pin 26, the rotary cylinder 7 can be rotated about the rotational axis 27 thereof in the direction of the arrow. The guide pin 29 slides downward along the guide slot 17, as can be seen in FIG. 5b. Because the guide pin 29 moves on a circle relative to the rotational axis 27, while the guide slot 17 is linear, the guide gate formed by the guide slot 17 and guide pin 29 forces the rotary cylinder 7 to be displaced in the horizontal direction to the right in the oblong hole 15. The pressure piece 6 follows this displacement and is thus displaced likewise to the right relative to the housing 5 until the pressure piece is seated against the right groove wall 31. During further rotation of the hexagonal wrench 33 in the direction of the arrow, a clamping force builds in the horizontal direction, which clamps the printed circuit board module 1 between the left groove wall 32 and the back wall 8 of the housing 5.

The oblong hole 15 and the guide slot 17 form an acute angle α of approximately 75°. The resulting sliding friction of the eccentric mechanism is so large that automatic backward rotation or backward displacement of the pressure cylinder 7 is precluded. The mechanism is blocked by way of a self-locking function. So as to release the clamped state of the printed circuit board module 1, the rotary cylinder 7 has to be manually rotated in the opposite direction by way of the hexagonal wrench 33, whereby the blockage is overcome.

The small arrows indicate the transport of heat. The waste heat from the printed circuit board module 1 introduced into the back wall 8 of the housing 5 flows over the lateral walls 8, 10 into the pressure piece 6 and from there into the cold plate 2.

The alternative clamping device according to FIG. 6 basically has the same design as the clamping device described above. The only difference is the drive mechanism.

The elongated housing 40 has a U-shaped cross-section, wherein a lower lateral wall 42 and an upper lateral wall 43 perpendicularly adjoin a flat back wall 41. The front side of the housing 40 is open, as is the end face.

A pressure piece 44 made of solid metal is displaceably mounted between the lateral walls 42, 43. The pressure piece 44 has the shape of an elongated rectangular cuboid, the cross-sectional shape of which is matched to the housing 40. A flat clamping surface 45 is provided at the front side of the pressure piece 44, the surface extending parallel to the back wall 41 of the housing 40. The back side of the pressure piece 44 comprises an elongated slot 46, which is designed in the manner of a notch and extends along the center line.

The drive mechanism that is used to displace the pressure piece 44 relative to the housing 40 here is a CALMARK Series 223 Card-Lok, which is inserted in the space between the back wall 41 and the pressure piece 44. The Card-Lok 47 comprises a threaded shaft 48, which extends parallel to the back wall 41 of the housing 40. A plurality of wedge elements are arranged in a row on the threaded shaft 48, including two end wedges 49 comprising a respective centric borehole for the threaded shaft 48 and first wedge-shaped pieces 50 and second wedge-shaped pieces 51, which are arranged between the end wedges and are likewise penetrated by the threaded shaft 48, but can be moved relative to the shaft and relative to the respective adjoining wedge element in the lateral direction.

The front free end of the threaded shaft 48 comprises a hexagon socket 52, in which a commercially available hexagonal wrench can be inserted as a rotary tool. During rotation of the threaded shaft 48, the wedge elements arranged in a row are pulled together because the wedge surfaces thereof slide on each other. The first wedge-shaped pieces 50 thus give way transversely relative to the wedge axis in the direction of the pressure piece 44, while the interposed second wedge-shaped pieces 51 migrate in the opposite direction and become seated from the inside against the back wall 41 of the housing 40. The first wedge-shaped pieces 50 carry the pressure piece 44 along, which is to say this piece is pushed out of the front side of the housing 40 until making contact with a wall of the mounting groove (see FIG. 1). The threaded shaft 48 can continue to be rotated until the clamping force between the groove wall, pressure piece 44, wedge-shaped pieces 50, 51, back wall 41 and printed circuit board module 1 to be mounted is sufficient.

A torque limiter integrated in the threaded shaft 48 protects the drive mechanism from overload. The friction between the threaded shaft 48 and thread prevents the clamped connection from loosening automatically, so that no further locking function is required. The clamped connection is simply manually released by turning the threaded shaft 48 in the opposite direction, whereby the wedge elements are pulled apart again and the pressure piece 44 can move into the housing 40.

While this invention has been described as having an exemplary design, the present invention may be further modified within the spirit and scope of this disclosure. This application is therefore intended to cover any variations, uses, or adaptations of the invention using its general principles.

REFERENCE NUMERALS

1 printed circuit board module
2 cold plate
3 mounting groove
4 clamping device
5 housing
6 pressure piece
7 rotary cylinder
8 back wall (of 5)
9 lower lateral wall
10 upper lateral wall
11 opening
12 right end wall
13 left end wall
14 oblong hole (in 12)
15 oblong hole (in 13)
16 guide slot (in 12)
17 guide groove (in 13)
18 upper angled stop
19 lower angled stop
20 clamping surface (of 6)
21 upper stop edge
22 lower stop edge
23 cut-out
24 longitudinal slot
25 bearing pin (of 7)
26 bearing pin
27 rotational axis
28 guide pin
29 guide pin
30 hexagon socket
31 right groove wall
32 left groove wall
33 hexagonal wrench
40 housing
41 back wall (of 40)
42 lower lateral wall
43 upper lateral wall
44 pressure piece
45 clamping surface (of 44)
46 longitudinal slot
47 Card-Lok
48 threaded shaft
49 end wedge
50 first wedge-shaped piece
51 second wedge-shaped piece
52 hexagon socket

What is claimed is:

1. A device for clamping a printed circuit board module in a mounting groove of a cold plate, comprising:
    an elongated housing made of metal, a cross-section of the housing having the shape of a horizontal U having a back, U limbs and a front side, wherein the back of the U is formed by a back wall, the U limbs are formed by lateral walls and the front side is substantially open;
    a pressure piece made of metal and having a thickness that is significantly greater than the thickness of the walls of the housing, the pressure piece being mounted between the lateral walls of the housing so as to be transversely displaceable relative to a longitudinal axis of the housing and having a flat clamping surface at a front side that extends along an entire length of the pressure piece and substantially an entire length of the housing, the flat clamping surface extending parallel to the back wall of the housing; and
    a drive mechanism, which is independent of and disposed between the back wall of the housing and the pressure piece and which pushes the pressure piece forward through the open front side of the housing at least so far that the pressure piece protrudes beyond the parallel lateral walls of the housing and an entire length of the flat clamping surface thereof can be seated against an opposing wall of the mounting groove wherein a line of contact between a back side of the pressure piece and the drive mechanism is in a plane parallel to the back wall.

2. The device according to claim 1, wherein the pressure piece is made of solid steel.

3. The device according to claim 2 wherein the pressure piece has a substantially rectangular cross-section which is matched to the cross-section of the housing.

4. The device according to claim 1 wherein the pressure piece has a substantially rectangular cross-section which is matched to the cross-section of the housing.

5. The device according to claim 4 wherein an upper face and/or lower face of the pressure piece comprise stop edges and the housing comprises corresponding angled stops in the region of the front edges of the lateral walls.

6. A device according to claim 5 wherein a back side of the pressure piece comprises a centrally disposed longitudinal slot which extends over the entire length.

7. A device according to claim 1 wherein the drive mechanism for the pressure piece is an eccentric mechanism.

8. The device according to claim 7, wherein:
    a rotary cylinder can be rotated about a rotational axis extending parallel to the longitudinal axis of the housing and is mounted displaceably transversely relative thereto in the housing;
    the rotary cylinder comprises eccentric guide elements which, during a rotation about the rotational axis, effect a displacement of the rotary cylinder transversely relative to the rotational axis; and
    the rotary cylinder is coupled to the pressure piece, so that the pressure piece follows the displacement of the rotary cylinder.

9. The device according to claim 8 wherein end faces of the rotary cylinder comprise bearing pins which are mounted in horizontal oblong holes in end walls of the housing.

10. The device according to claim 9 wherein end faces of the rotary cylinder comprise eccentrically disposed guide pins which engage in guide slots or guide grooves in end walls of the housing.

11. The device according to claim 9 wherein at least one bearing pin of the rotary cylinder is guided through one of the end walls of the housing and at a free end of the one bearing pin comprises a holder for the positive engagement of a rotary tool.

12. The device according to claim 11 wherein the rotary tool is a hexagonal wrench.

13. The device according to claim 8 wherein end faces of the rotary cylinder comprise eccentrically disposed guide pins which engage in guide slots or guide grooves in end walls of the housing.

14. The device according to claim 13 wherein the guide slots or guide grooves are arranged at an acute angle relative to oblong holes in end walls of the housing and wherein the oblong holes serve as bearings.

15. The device according to claim 14 wherein the angle is dimensioned so that the rotary cylinder is prevented from performing an automatic rotation by a self-locking function.

16. The device of claim 1, wherein the pressure piece has a longitudinal slot which extends over the entire length, wherein the longitudinal slot allows the pressure piece to bend open slightly under the mechanical pressure exerted by the drive mechanism on the pressure piece.

17. A device for clamping a printed circuit board module in a mounting groove of a cold plate, comprising:
an elongated housing made of metal, a cross-section of the housing having the shape of a horizontal U having a back, U limbs and a front side, wherein the back of the U is formed by a back wall, the U limbs are formed by lateral walls and the front side is substantially open;
a pressure piece made of metal and having a thickness that is significantly greater than the thickness of the walls of the housing, the pressure piece being mounted between the lateral walls of the housing so as to be transversely displaceable relative to a longitudinal axis of the housing and having a flat clamping surface at a front side, the flat clamping surface extending parallel to the back wall of the housing, wherein a back side of the pressure piece comprises a centrally disposed longitudinal slot which extends over the entire length; and
a drive mechanism, which is disposed between the back wall of the housing and the pressure piece and which pushes the pressure piece forward through the open front side of the housing at least so far that the pressure piece protrudes beyond the parallel lateral walls of the housing and an entire length of the flat clamping surface thereof can be seated against an opposing wall of the mounting groove.

18. A device according to claim 17 wherein the drive mechanism for the pressure piece is an eccentric mechanism.

19. A device for clamping a printed circuit board module in a mounting groove of a cold plate, comprising:
an elongated housing made of metal, a cross-section of the housing having the shape of a horizontal U having a back, U limbs and a front side, wherein the back of the U is formed by a back wall, the U limbs are formed by lateral walls and the front side is substantially open;
a pressure piece made of metal and having a thickness that is significantly greater than the thickness of the walls of the housing, the pressure piece being mounted between the lateral walls of the housing so as to be transversely displaceable relative to a longitudinal axis of the housing and having a flat clamping surface at a front side that extends along an entire length of the pressure piece and substantially an entire length of the housing, the flat clamping surface extending parallel to the back wall of the housing; and
a drive mechanism, which is independent of and disposed between the back wall of the housing and the pressure piece and which pushes the pressure piece forward through the open front side of the housing at least so far that the pressure piece protrudes beyond the parallel lateral walls of the housing and an entire length of the flat clamping surface thereof can be seated against an opposing wall of the mounting groove;
wherein the drive mechanism for the pressure piece comprises a number of wedge elements which are arranged in a row on a threaded shaft, an axis of the threaded shaft being parallel to the back wall of the housing, wherein the wedge elements are pulled together by a rotation of the threaded shaft and give way laterally at least to some degree, whereby at least one wedge element is pressed against a back side of the pressure piece along a line of contact which is in a plane parallel to the back wall and pushes the same forward, and at least one other wedge element is pressed against the back wall of the housing to generate counter-pressure.

20. The device according to claim 19, wherein a free end of the threaded shaft comprises a holder for the positive engagement of a rotary tool.

21. The device of claim 20 wherein the rotary tool is a hexagonal wrench.

22. The device of claim 19, wherein the pressure piece has a substantially rectangular solid cross-section.

23. The device of claim 19, wherein the back side of the pressure piece has a longitudinal slot which extends over the entire length, wherein the longitudinal slot allows the pressure piece to bend open slightly under the mechanical pressure exerted by the drive mechanism on the pressure piece.

* * * * *